– – –
United States Patent [19]

Heinz

[11] Patent Number: 4,491,934

[45] Date of Patent: Jan. 1, 1985

[54] DATA COMPRESSION PROCESS

[76] Inventor: Karl E. Heinz, Niebuhrstrasse 49, D-5300 Bonn 1, Fed. Rep. of Germany

[21] Appl. No.: 377,575

[22] Filed: May 12, 1982

[51] Int. Cl.³ .............................................. G06F 1/00
[52] U.S. Cl. ................................................... 364/900
[58] Field of Search .................... 364/900 MS File; 235/310; 340/347 DD

[56] References Cited

U.S. PATENT DOCUMENTS

3,914,586 10/1975 McIntosh ........................... 235/310

Primary Examiner—Raulfe B. Zache
Attorney, Agent, or Firm—Gifford, VanOphem, Sheridan, Sprinkle & Nabozny

[57] ABSTRACT

The present invention provides a method for data compression and decompression of redundant serial data. The first and second elements of the serial data are combined to form a first pair group which is assigned a code designation and stored in a group list. Thereafter, the code designation of the previous pair group and the next element are combined to form a further pair group which is assigned to form a further code designation and this process is reiterated until a closing character is reached. For the second and subsequent sequences of serial data, the elements of the code data are combined and assigned a code designation as discussed above but with further checking to determine whether the first pair group is identical with the first pair group of a previously stored data component. If so, the code designation of the previously stored pair group is combined with the element and the data list and the subsequent incoming data is compared with the previously stored data list until the end of the identity between the data list is reached. When this occurs, a code designation of the last identical pair group in the previously stored group list is assigned a code designation which is stored in memory and the above process is repeated until the end of the serial data.

35 Claims, 1 Drawing Figure

FIG. 1

DATA COMPRESSION PROCESS

BACKGROUND OF THE INVENTION

The present invention relates generally to a process for the compression of redundant sequences of serial data elements and more particularly a process for the compression of redundant sequences of serial data elements, which are divided into partial sequences or sequence components each having any number of data elements and a closing character, and also a process for decompression of such compressed sequences of serial data elements.

Communications and specifically data sequences are frequently redundant to a high degree, that is to say, they contain a substantially larger number of data elements or characters than would be required for representing the information contained in the communication message. An example in this respect is the transmission of television pictures wherein the fields which are successively recorded and then stored or transmitted are identical, in regard to those areas of a scene which have not experienced any change in regard to the position, brightness or colour of the picture points or elements. This is generally the situation with the major part of all picture points or elements. Therefore, in a known process for reducing the degree of redundancy in television pictures, the transmission of signals is restricted to those picture points or groups of picture points, in which there has been a change between the fields.

There are of course other examples of redundancy situations similar to that described above with reference to television transmission, such as for example language texts which tend to be redundant to a high degree, for they use inter alia units of a dictionary which are very often made up of identical sequence components of smaller units (for example letters).

SUMMARY OF THE INVENTION

An object of the present invention is to provide a data compression process such as easily and automatically, that is to say, mechanically, to reduce the redundancy in sequences of serial data elements. A further object of the invention is to provide a data compression process which simplifies the processing and in particular storage and transmission of compressed sequences.

Still another object of the present invention is to provide a method of automatically combining sequences of serial data elements, by means of a data compression process.

BRIEF DESCRIPTION OF THE DRAWING

A better understanding of the present invention will be had upon reference to the following detailed description when read in conjunction with the accompanying drawing which depicts a flow chart of the preferred embodiment of the present invention.

DETAILED DESCRIPTION OF THE PREFERRED EMBODIMENT OF THE INVENTION

Figure 1:
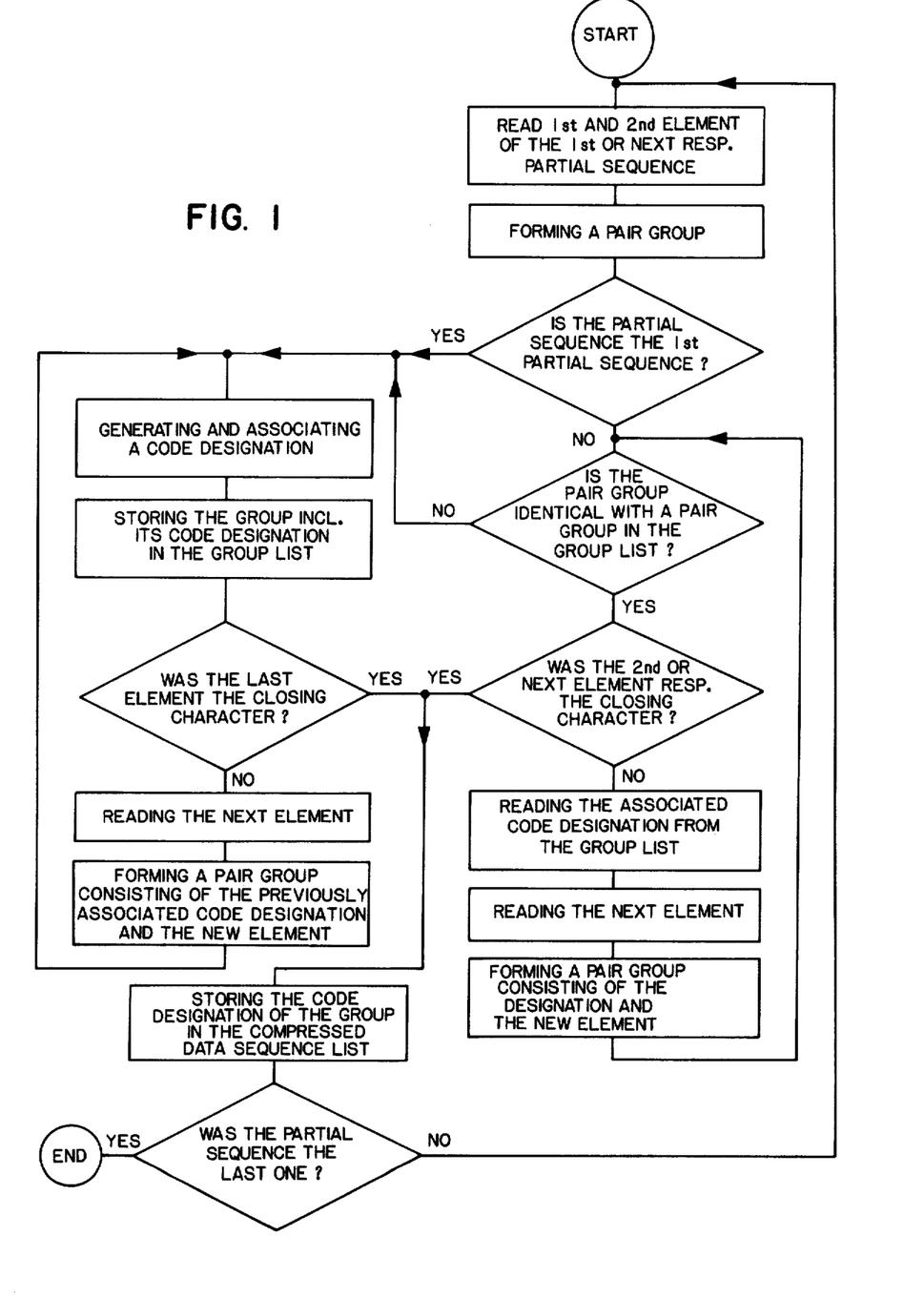

The preferred embodiment of the present invention will be understood by reference to FIG. 1 which depicts a flow chart of the preferred embodiment.

These and other objects are achieved by a process for the compression of redundant sequences of serial data elements which are divided into partial sequences or sequence components each having any number of data elements and a clearing or closing character, wherein, in respect of the first sequence component:

(1) the first and second elements are combined together to form a first pair group which receives a code designation and which is stored in a group list, together with the code designation;

(2) the code designation of the first group and the third element of the sequence component are combined to form a further pair group which receives a code designation and which is stored in the group list, together with its code designation;

(3) the code designation of the further group and the following element of the sequence component are combined to form yet a further pair group which receives a code designation, etc, until the closing or clearing character which, with the code designation of the preceding group, forms a last pair group which in turn receives a code designation and which is stored in the group list together with that code designation.

In respect of the second and further sequence components:

(4) steps (1) through (3) above are repeated, but with a check as to whether the first group is identical to the first group of the first sequence component or one of the further sequence components; if no, the process proceeds as in the case of the first sequence component; if yes, the code designation of the first group is combined with the third element and a check is again made whether that further pair group is identical to the further group of the first or the further sequence component; if yes, the code designation of the further group is combined with the following element, and so forth, to the end of the condition of coincidence between the groups being compared;

(5) the code designation of the last identical group is stored in the group list, and further elements are possibly processed as set forth in step (3) above; and (6) each sequence component is identified in a compressed data sequence list by the code designation of its last group.

For the purposes of decompression of a sequence of serial data elements, which has been compressed in the aboveindicated manner, the procedure involves:

(1) calling up the first code designation in the compressed data sequence list;

(2) checking whether the first member of the pair group identified by that code designation is a code designation or a data element; if it is a data element, output the group and go to step (5) below; if it is a code designation, go to step (3);

(3) repeat checking step (2) in respect of the group designated by the code designation, until reaching an initial or opening group, the first member of which is a data element;

(4) output of said initial group and the second member of all groups which have been previously run through; and (5) repeat the procedure for all subsequent code designations in the compressed data sequence list.

The expression 'sequence of serial data elements' is used in accordance with this invention to denote any kinds of such sequences, for example the successively scanned and reproduced picture points or elements of television pictures, letters, figures, characters of a language or text, and other sequences of data elements or information units. Typical examples in respect of 'sequence components', as referred to hereinbefore, are the lines of a television picture which contain a predetermined number of data elements in the form of picture points, or texts whose words, each having a number of data elements in the form of letters, figures or characters, form the sequence components. The 'closing character' separates the individual sequence components from each other. It may be a particular character from the stock of characters employed, or it may comprise a character sequence, or may even simply be just an empty space or a gap between the sequence components.

For a given sequence of serial data elements, for example for a given language text, the lists which are derived and stored in accordance with the process of the present invention occupy only a substantially smaller storage space than the data sequence itself. This applies when long redundant data sequences are processed. Thus for example, when dealing with a text of considerable length, virtually all data elements (letters and characters) and virtually all sequence components (words) will have occurred after just a short time, so that further processing of the text only results in a slight increase in the size of the group list, with an individual entry in the compressed list.

When transmitting data sequences, it is possible for the lists which are drawn up in accordance with the process of the present invention to be transmitted, but it is also possible, for a given type of data sequences, for example texts in the German language, to draw up a group list once and for all, using the appropriate dictionary for the sequence components (words); the group list drawn up is then available at the transmitting and receiving ends, so that only the compressed list has to be transmitted, for given texts. A similar situation also applies in regard to the storage of data sequences.

In a development of the basic principle of the invention, it is possible to use a group list with three-location groups, the index of the third location or place in each group being the code designation of that group. Such a procedure includes, in respect of the first sequence component:

(1) entry of the first element of the sequence component at the first location of a group in the group list with three-location groups, the index of the third location of each group being the code designation thereof;

(2) entry of the second element at the second location of the group;

(3) entry of the index of the third location as code designation at the first location of a further group on the list;

(4) entry of the index of the first position of the further group in accordance with step (3) above at the third location of the preceding group;

(5) entry of the following element at the second location of a further group;

(6) entry of the index of the third location as code designation at the first location of a further group of the list;

(7) entry of the index of the first location of the further group, in accordance with step (6) above, at the third location of the preceding group;

(8) repetition of steps (5) to (7) of this procedure for all following elements of the sequence component including the closing character; and (9) entry of the index for the third location of the group, which contains the closing character at the second location, at a first location of a compressed data sequence list, and transferring the index of that location to the third location of the closing character group; and in respect of further sequence components:

(10) checking whether there is in the list a group which contains the first element at the first location and the second element at the second location; if no, go to step (11) below, if yes, go to step (12) below;

(11a) entry of the first and second elements at the first and second locations respectively of a further group in the list;

(11b) carry out steps (3) through (9);

(12) check whether the group set forth in step (10) above is followed by a group which contains the following element at the second location; if no, go to step (13); if yes, go to step (14);

(13) carry out step (6) for the group set forth in step (10), and steps (8) and (9) above;

(14) check whether the following group as set forth in step (12) is in turn followed by a group which contains the following element at the second location; if no, go to step (15) below, if yes, go to step (16) below;

(15) carry out steps (6) and (7) for the following group of step (12), and steps (8) and (9); and (16) repeat step (14) for the next following group.

For the purposes of decompressing a sequence compressed as set forth above, the procedure involves:

(1) calling up the first entry of the compressed list;

(2) checking whether the entry is the index for the third location of a group in the list; if no, output the entry and go to step (6) below, if yes, go to step (3) below;

(3) check whether the entry at the first location of the group is the index for the third location of a preceding group in the list; if no, output the entry of the first and second locations of the group and go to step (6) below, if yes, go to step (4) below;

(4) repeat the check of step (3) above for the preceding group, until reaching an initial or opening group in the list of groups, in respect of which the entry at the first location is an element;

(5) output of the entry of the first and second locations of the opening group and the second location of all groups which have been previously run through, including the group set forth in step (2) above; and (6) repeat the procedure for the next entry of the compressed list.

A simplification in the group list for searching operations is achieved when the entry of a following element at the second location of a group is effected only when that element has not already been entered at the first or second location of a preceding group. In that case, instead of the element, only the index of the previous entry is utilised. In another procedural operation, after entry of the index of the third location of a group at the first location of a further group, a check may be made to ascertain whether that index is already entered at the first location of a preceding group, and then possibly to replace the preceding entry.

Another development of the invention provides that it is not the elements of a sequence themselves which are entered in the group list, but instead, to simplify referencing and searching operations, the data elements are first entered in a special character list when each such data element first occurs, with the data elements entered in the list having allocated thereto a code in the form of the character list index which is then used in the group list or the compressed data sequence list. In addition, the character list contains, in respect of each data element, the respective index of the group list or the compressed data sequence list, for the first occurrence of the element. Reference may be made to claim 9 hereinafter for the steps of the operating procedure involved, and to claim 10 hereinafter for the steps of the associated data decompression process. The above-described ways of simplifying the group list may also be employed in this context.

A possible way of reducing the group lists provides that, instead of using a group list with three-location groups, the group list used has only two-location groups. Instead of using the index of the third location as the code designation for the respectively preceding group, the index of the first location of each subsequent group is used as the code designation for the respective directly preceding group. Reference may be made to claim 15 hereinafter for the steps involved in that operating procedure, and to claim 16 for the associated data decompression process. Once again, the above-discussed ways of simplifying the group list may also be applied to the two-location group lists mentioned above. It is also possible additionally to draw up a character list and to replace the data elements in the group list and the compressed data sequence list, in which respect reference may be made to claims 21 and 22 hereinafter.

For the purposes of simplifying searching operations in the compressed data sequence list, a further aspect of the invention provides that, in a similar manner as in regard to the entries in the group list, after entry of a code designation in the compressed data sequence list, a check is made whether that code designation has already been entered at a previous location. If that is found to be the case, the previous entry is replaced by the index of the location just being considered.

If, when dealing with texts which are divided on a line basis, each line shift is to be detected, after a given number of words or elements, a further aspect of the invention provides that in each case the code designation of the group containing the last element of a line has a negative sign.

Memory stores can be easily enlarged or interconnected in succession, in a further aspect of the invention, in that the stores used for storage of the lists are connected together sequentially and references in the lists, which lead to a location beyond the directly following store or a higher location of the directly following store are provided with an identification means. The identification means, which in the simplest situation may be a negative sign and the reference to a particular list, then produces a further step in the process, which comprises interrogating the particular list in which the respective store allocation and store location is specified. This aspect of the invention applies in regard to references in all lists discussed, that is to say, character, group and compressed data sequence lists. As, in all situations, the references always lead to higher locations, there is no need for identification in regard to a reference to a lower location in a directly adjoining store.

A further aspect of the invention is directed to use of the data compression process in accordance with the present invention, which is concerned with automatically combining such sequences of serial data elements, wherein the junction or node points of the combination are formed by identical sequence components. The identical sequence components may be established in the associated compressed data sequence lists of the sequences to be combined.

In that respect, for the purposes of making a connection between a starting or initial point which is in a first sequence and a target point which is in a second sequence, the procedure may involve seeking an identical sequence component in the compressed data sequence lists of the two sequences. That presupposes that there is a junction or node point between the two sequences in question. If, in a further aspect of the invention, a connection is to be made between a starting point which is in a first sequence and a target point which is in a second sequence which is not directly combined with a first sequence, the compressed data sequence lists of the first and second sequences are each compared to the compressed data sequence lists of further sequences, in order to find a closed connecting path by way of identical sequence components of two respective sequences which are directly combined together. The search procedure may be substantially simplified by a further aspect of the invention which provides that the junction or nodes points are stored in a separate list.

The above-described uses of the data compression and decompression processes of the present invention may be used for example for determining connections in a transport system, for example a rail network. Direct connections between a starting point and a target point, that is to say for example between two stations on the same line of track may then be found by the two points being disposed in the same sequence of serial data elements, the sequence components representing for example station names in a timetable or schedule as the text. In regard to a transportation change ('interchange'), the connections are formed by the junction or node points of sequences which are combined together, for example the timetables or schedules for intersecting transportation lines with interchange stations. In such a system, it is possible for the stored data to have further data associated therewith, for example distance, time information in regard to arrival and departure (schedule), and so on. In this way, information about possible existing connections between any points in a network or system can be provided rapidly and without a large amount of computation and storage.

EXAMPLES

Modes of procedure in accordance with the principles of the present invention are described hereinafter with reference to simple Examples, each of which is concerned with a data sequence which serially contains the two words 'ABER' (being the German word for BUT) and 'ABEND' (being the German word for EVENING), each of which has a terminal or closing character (*).

Table 1 below shows the original data sequence list:

TABLE 1

| Data sequence list | |
|---|---|
| Index | Element |
| 1 | A |
| 2 | B |
| 3 | E |
| 4 | R |
| 5 | * |
| 6 | A |
| 7 | B |
| 8 | E |
| 9 | N |
| 10 | D |
| 11 | * |

Group list I and compressed list I as shown in Tables 2 and 3 below are then made up, using the steps of the process which is set forth in claim 3 hereinafter, to which reference is therefore directed:

TABLE 2

| Group list I | |  |
|---|---|---|
| Index | Entry | |
| 100 | A | |
| 101 | B | |
| 102 | 103 | |
| 103 | 102 | |
| 104 | E | |
| 105 | 106 | |
| 106 | 105 | (112) |
| 107 | R | |
| 108 | 109 | |
| 109 | 108 | |
| 110 | * | (119) |
| 111 | 1000 | |
| 112 | 105 | |
| 113 | N | |
| 114 | 115 | |
| 115 | 114 | |
| 116 | D | |
| 117 | 118 | |
| 118 | 117 | |
| 119 | * | |
| 120 | 1001 | |

TABLE 3

| Compressed list I | |
|---|---|
| Index | Entry |
| 1000 | 111 |
| 1001 | 120 |

Therefore, with regard to the first sequence component, that is to say, the first word 'ABER *', step (1) recited in claim 3 is performed first, whereby the first element A is entered at the location bearing the index 100 of the group list I, the first three-location group comprising the three locations 100, 101 and 102. Step (2) of the process recited in claim 3 is then performed, and the second element B is entered at the second location 101. Recited step (3) results in the index 102 of the third location being entered, as the code designation of the group, at the first location 103 of the second group. The index 103 of the first location is then entered at the third location 102 of the first group, as recited in step (4) of claim 1. The following element E is then entered at the second location 104 of the second group, and this is then followed by step 6 of the process recited in claim 3, whereby the index 105 of the third location in the group is entered at the first location 106 in the third group. The bracketed entry 112 is disregarded for the time being. After step 7 of the process recited in claim 3 has been performed, whereby the index 106 of the first location has been entered at the third location 105 of the second group, steps 5 through 7 of the claim 3 process are repeated in respect of the further elememts E, R and * of the first word 'ABER *'. The closing character * is then finally entered at location 110. Here too the bracketed entry 119 is disregarded for the time being. The index 111 in respect of the third location of the associated group is then entered at the first location 1000 of the compressed list I set forth in Table 3.

In regard to the second or further sequence component, that is to say, the word 'ABEND *', the further steps of the method recited as steps (10) through (16) in claim 3 are then performed. Firstly, the checking operation shows that the first group 100 through 102 in the group list contains the first element A at the first location 100 and the second element B at the second location 101. Consequently, the procedure goes to step 12 of the process recited in claim 3. It is established that the group 100 through 102 which is found as a result of the checking operation of step 12 is followed by a group 103 through 105 which contains the following element E of 'ABEND', at the second location 104. The procedure then goes to step (14) of the process recited in claim 3. Here, the checking operation performed shows that in this case the group 103 through 105 is not followed by a group which contains the following element N at the second location. Instead, the following group 106 through 108 contains the element R at the second location. Therefore, step (15) of the process recited in claim 3 is to be performed so that step (6) is first carried out, whereby the index 105 of the third location of the group is entered as the code designation at the first location 112 of a further group 112 through 114. Performance of further steps (8) and (9) of the process recited in claim 3 then results in the specified entries in the group list and entry of the index 120 at the second location 1001 of the compressed list I.

The decompression procedure may be easily followed by referring to the steps set forth in claim 4 hereinafter and Tables 2 and 3, to which attention should therefore now be directed. After the first entry 111 of the compressed data sequence list has been called up, the checking operation which is set forth in step (2) of claim 4 shows that the entry called up is an index in respect of the third location of the group 109 through 111 in the group list. Further checking as set forth in step (3) of claim 4 shows that the entry 108 at the first location of the group is once again the index in respect of the third location of the preceding group 106 through 108. By twice repeating the checking operation, with the same result, the procedure reaches the first group 100 through 102 in respect of which the entry at the first location is the element A. By output of the entry A and B at the first and second locations respectively of the initial group and the second location 104, 107, 110 of all groups which have been previously run through, the original word 'ABER*' is obtained. The bracketed expressions once again remain disregarded for the time being.

In regard to the second entry 120 in the compressed list, the checking operation in accordance with step (2) in claim 4 again shows that this is the index in respect of the third location of the group 118 through 120 in the group list. The next checking operation in accordance with step (3) in claim 4 also shows that the entry 117 at the first location of that group is the index of the third location of the preceding group 115 to 117. The same also applies to the next checking operation as set forth in step (3), for the entry 114 at the location 115 is once again the index in respect of the third location of the group 112 through 114. The next checking operation in accordance with that step in claim 4 also shows that the entry 105 at the first location 112 is the index for the third location of the preceding group 103 through 105. The same result is achieved with the further checking operation, which reaches the initial group 100 through 102. The procedure then comprises output of the two elements A, B of the initial group and the second elements E, N, D, * of the respective groups 103 through 105, 112 through 114, 115 through 117 and 118 through 120.

In one aspect of the data compression process in accordance with the principles of this invention, after entry of the following element * at the second location 119 of the group 118 through 120, a check is made whether that element is already entered at the first or second location 109 and 110 respectively of the preceding group 109 through 111. In fact, it is found that the element * is already entered at the second location 110. The earlier entry is then replaced by the index 119 of the second entry so that the bracketed term 119 now occurs at the location 110. In decompression of the compressed data, before output of the entry 119 of the second location 110 of the group 109 to 111, a check is made as to whether the entry is an index in respect of the first or second locations of a subsequent group (that is to say, group 118 through 120). If yes, the check for the entry * at the first or second locations of the subsequent group and possibly further groups are repeated, until reaching an element (*) and output of that element. Thus, in this example, the checking step in respect of the second location 110 of the group 109 through 111 reveals that the entry 119 is in fact the index in respect of the second location of the group 118 through 120, so that the element * is then outputted.

Another embodiment in accordance with the principles of the process according to the invention provides that, after entry of the index, for example in this case 105, of the first location of a group, for example in this case the group 103 through 105, at the first location, for example 112, of the further group 112 through 114, a check is made whether that index 105 has already been entered at the first location 106 of the preceding group at 106 through 108. If so, then that preceding entry is replaced by the index 112 of the entry in the further group 112 through 114. In fact, in the example under consideration here, this operating procedure results in the entry 105 at the location 106 being replaced by the index 112, so that the bracketed term then also applies here. In decompressing the compressed data, in general terms, before step (3) of the process set forth in claim 4 is performed, a check is made to ascertain whether the entry, in this example the entry 112, at the first location, for example 106, of a group 106 through 108, is the index 112 in respect of the first location of a subsequent group 112 through 114. If yes, the checking operation in respect of the entry 105 at the first location 112 is repeated, until reaching an index 105 for the third location of a preceding group.

Reference will now be made to Tables 4 and 5 of which Table 4 shows the character list of the embodiment of the invention, while Table 5 shows the group list II:

TABLE 4

| | Character list | |
|---|---|---|
| Index | Element | Location of the group list |
| 1 | A | 100 |
| 2 | B | 101 |
| 3 | E | 104 |
| 4 | R | 107 |
| 5 | * | 110 |
| 6 | N | 113 |
| 7 | D | 116 |

TABLE 5

| | Group list II | |
|---|---|---|
| Index | Entry | |
| 100 | 1 | |
| 101 | 2 | |
| 102 | 103 | |
| 103 | 102 | |
| 104 | 3 | |
| 105 | 106 | |
| 106 | 105 | (112) |
| 107 | 4 | |
| 108 | 109 | |
| 109 | 108 | |
| 110 | 5 | (119) |
| 111 | 1000 | |
| 112 | 105 | |
| 113 | 6 | |
| 114 | 115 | |
| 115 | 114 | |
| 116 | 7 | |
| 117 | 118 | |
| 118 | 117 | |
| 119 | 5 | |
| 120 | 1001 | |

In Table 4, in accordance with the process set forth in claim 9 hereinafter, to which reference may conveniently be made, instead of the elements, it is the respective index of the character list which is entered in a group list II as shown in Table 5. The individual steps of the process will be readily followed by referring to claim 9, in order to avoid repetition herein. The associated compressed data sequence list is once again the list set forth in Table 3. The steps of the process for decompression of the compressed sequence of serial data elements are set forth in claim 10, to which reference may conveniently be made at this point, for the sake of avoiding repetition. In group list II, it will be noted that the bracketed terms at locations 106 and 110 do not initially apply, in a similar manner to the bracketed terms 112 and 119 in group list I described above. The bracketed terms are then subsequently entered, in accordance with the procedural steps set forth in claim 11 and claim 13 respectively, to which reference may be made.

The character list set out in Table 4 substantially facilitates searching operations for finding given keywords because the elements do not occur in scattered form in the group list, but are combined together in the short character list. The associated entries of the respective location in the group list and the compressed data sequence list respectively, at which the corresponding element is to be found, permit immediate access to the group list and to the compressed data sequence list respectively.

Reference will now be made to Tables 6 and 7:

TABLE 6

| | Reduced group list I | |
|---|---|---|
| Index | Entry | |
| 100 | A | |
| 101 | B | |
| 102 | 102 | |
| 103 | E | |
| 104 | 104 | (109) |
| 105 | R | |
| 106 | 106 | |
| 107 | * | (114) |
| 108 | 1000 | |
| 109 | 109 | (104) |
| 110 | N | |
| 111 | 111 | |
| 112 | 0 | |

TABLE 6-continued

| Reduced group list I | |
|---|---|
| Index | Entry |
| 113 | 113 |

TABLE 7

| Compressed list II | |
|---|---|
| Index | Entry |
| 1000 | 108 |
| 1001 | 115 |

Generation of the reduced group list I of Table 6 and the associated compressed list II of Table 7 can once again be readily appreciated by referring to the steps of the process set forth in claim 15, to which reference may conveniently be made for the avoidance of repetition. The same also applies in regard to the reduced group list II set forth in Table 8 below, for which the steps of the process set forth in claim 21 to which reference is now made are performed:

TABLE 8

| Reduced group list II | | |
|---|---|---|
| Index | Entry | |
| 100 | 1 | |
| 101 | 2 | |
| 102 | 102 | |
| 103 | 3 | |
| 104 | 104 | (109) |
| 105 | 4 | |
| 106 | 106 | |
| 107 | 5 | (114) |
| 108 | 1000 | |
| 109 | 109 | (104) |
| 110 | 6 | |
| 111 | 111 | |
| 112 | 7 | |
| 113 | 113 | |
| 114 | 5 | |
| 115 | 1001 | |

The associated character list is the list set forth in Table 4 above. Reference may now be conveniently made to claims 16 and 22 respectively, for the steps of the respective data decompression processes. Once again, the bracketed terms represent the additional developments, similarly to those described hereinbefore.

The following Example will now be given, in regard to the further aspect of the invention which relates to uses thereof in the automatic combination or intercommunication of sequences of serial data elements.

Three sequences of serial data elements will be considered, the partial sequences or sequence components of which represent for example points (stations) on three connecting lines or tracks. The three sequences themselves each designate given connections on the tracks or lines.

Unlike the above-discussed Examples, the sequence components in this Example, that is to say, the points, are here represented by letters, for the purposes of simplification. The compressed data sequence lists for the three sequences read as follows:

A B C D E F G C H I J K L H M

The list of junction or node points for the combinations as between the three sequences is then as follows, with each individual value being designated by the initial point of a connection, the node point or points and the final or terminal point of the connection:

A C F / A C G / A C H / A C I / B C F / . . . / A C H J / A C H K / . . .

The components involved in the connection A/J are therefore:

A C - C H - H J.

Various other modifications and alterations may be made in accordance with the principles of the present invention without thereby departing from the spirit and scope thereof.

I claim:

1. A machine process for the compression of redundant sequences of serial data elements which are divided into sequence components each having any number of data elements and a closing character, comprising the following steps:

I. for the first sequence component:
(1) the first and second elements are combined to form a first pair group which receives a code designation and which is stored together therewith in a group list;
(2) the code designation of the first pair group and the third element are combined to form a further pair group which receives a code designation and which is stored together therewith in the group list; and
(3) the code designation of the further pair group and the following element are combined to form a further pair group which receives a code designation, and so forth, to the closing character which with the code designation of the preceding pair group forms a last pair group which in turn receives a code designation and which is stored together therewith in the group list;

II. for the second and further sequence components:
(4) steps (1) through (3) are repeated, but with checking as to whether the first pair group is identical with the first pair group of the first sequence component or one of the further sequence components; if no, then proceed as in respect of the first sequence component;
if yes, the code designation of the first pair group is combined with the third element and a check is again made as to whether that further pair group is identical with the further pair group of said first or said further sequence component;
if yes the code designation of the further pair group is combined with the following element, and so forth, to the end of identity between the groups;
(5) the code designation of the last identical pair group is stored in the group list and any further elements which occur are processed in accordance with step (3); and
(6) each sequence component is identified in a compressed data sequence list by the code designation of its last pair group.

2. A process for the decompression of a sequence of serial data elements compressed as set forth in claim 1, comprising the following steps:
(1) calling up the first code designation in the compressed data sequence list;
(2) checking whether the first member of the group identified by the code designation is a code designation or an element; if an element, output of the pair group and go to step (5), if a code designation, go to step (3);
(3) repeating the checking operation of step (2) for the group designated by the code designation, until reaching an initial group, of which the first member is an element;

(4) output of the said initial group and the second member of all groups which have been previously run through; and (5) repeating the procedure for all subsequent code designations in the compressed data sequence list.

3. A data compression process as set forth in claim 1 comprising the following steps:

I. for the first component sequence:

(1) entry of the first element at the first location of a group in the group list with three-location groups, wherein the index of the third location of each group is the code designation of that group;

(2) entry of the second element at the second location of the group of the group list;

(3) entry of the index of the third location of a group as a code designation at the first location of a further group of the group list;

(4) entry of the index of the first location of the further group of step (3) at the third location of the preceding group;

(5) entry of the following element at the second location of a further group of the group list;

(6) entry of the index of the third location of a group as a code designation at the first location of a further group of the group list;

(7) entry of the index of the first location of the further group set forth in step (6) at the third location of the preceding group;

(8) repetition of steps (5) through (7) for all following elements of the sequence component including the closing character; and (9) entry of the index for the third location of the group which contains the closing character at the second location, at a first location of a compressed data sequence list, and transfer of the index of said location to the third location of the closing character group;

II. for the further sequence components:

(10) checking whether the group list includes a group which contains the first element at the first location and the second element at the second location; if no, go to step (11) below, if yes, go to step (12) below;

(11a) entry of the first and second elements at the first and second locations respectively of a further group in the group list;

(11b) performance of steps (3) through (9) above;

(12) checking whether the group set forth in step (10) above is followed by a further group which contains the following element at a second location; if no, go to step (13) below, if yes, go to step (14) below;

(13) performance of step (6) above for the group set forth in step (10), and steps (8) and (9);

(14) checking whether said following group set forth in step (12) is in turn followed by a group which contains the following element at a second location; if no, go to step (15) below, if yes, go to step (16) below;

(15) performance of steps (6) and (7) for said following group set forth in step (12) above, and steps (8) and (9); and (16) repetition of step (14) for the next following group.

4. A process for decompression of a sequence compressed as set forth in claim 3, comprising the following steps:

I.

(1) calling up the first entry of the compressed data sequence list;

(2) checking whether the entry is the index in respect of the third location of a group in the group list; if no, output of the entry and go to step (6) below, if yes, go to step (3);

(3) checking whether the entry at the first location of the group is the index in respect of the third location of a preceding group in the group list; if no, output of the entry of the first and second locations of the group and go to step (6) below, if yes, go to step (4) below;

(4) repeating the checking operation of step (3) above in respect of the preceding group, until reaching an initial group in the group list, in which the entry at the first location is an element;

(5) output of the entry of the first and second locations of said initial group and the second location of all groups which have been previously run through, including the group set forth in step (2) above; and (6) repeating the procedure for the next entry of the compressed data sequence list.

5. A data compression process as set forth in claim 3 wherein, after the entry of a following element at the second location of a further group, a check is made as to whether said element has already been entered at one of the first and second locations of a preceding group and if yes, said preceding entry is replaced by the index of the entry in said further group.

6. A process for the decompression of a sequence compressed as set forth in claim 5, wherein, before output of the entry of the second location of a group, a check is made whether the entry is an index in respect of one of the first and second locations of a subsequent group and if yes, the checking operation in respect of the entry at said one of said first and second locations of said subsequent group and possibly further groups is repeated until an element is reached, for output thereof.

7. A data compression process as set forth in claim 3 wherein, after the entry of the index of the third location of a group at the first location of a further group, a check is made as to whether said index has already been entered at the first location of a preceding group and if yes, said preceding entry is replaced by the index of the entry in the further group.

8. A process for the decompression of a sequence compressed as set forth in claim 7 wherein, before step (3) as set forth in claim 4 is carried out, a check is made as to whether the entry at the first location of a group is the index in respect of the first location of a subsequent group and if yes, the checking operation in respect of the entry at the first location of said subsequent group is repeated until reaching an index in respect of the third location of a preceding group.

9. A data compression process as set forth in claim 1 comprising the following steps:

I. for the first sequence component;

(1) entry of the first element at a first location of a first column of a character list;

(2) entry of the character list index in respect of said first element at the first location of a group in a group list having three-location groups, wherein the index of the third location of each group is the code designation of that group;

(3) entry of the index of the first location of said group as set forth in step (2) in the second column of the character list at said first location of step (1);

(4) checking whether the second element is already present in the first column of the character list and if no, entry of the second element at the subsequent location in the first column of the character list;

(5) entry of the character list index in respect of the second element at the second location of the first-mentioned group of the group list;

(6) entry of the index in respect of the second location of the first-mentioned group in the second column of the character list at the location set forth in step (4) above;

(7) entry of the index of the third location of the first-mentioned group as the code designation of the group at the first location of a further group of the list;

(8) entry of the index of the first location of said further group at the third location of the preceding group;

(9) checking whether the following element is already present in the first column of the character list and if no, entry at the following location in the first column of the character list;

(10) entry of the character list index in respect of the following element at the second location of a further group in the group list;

(11) entry of the index of the second location of said further group in the second column of the character list at the location set forth in step (9) above;

(12) entry of the index of the second location of said group as the code designation at the first location of another group of said list;

(13) entry of the index of the first location of said another group at the third location of the preceding group;

(14) repetition of steps (9) through (13) above for all following elements of the sequence component including the closing character;

(15) entry of the group list index in respect of the third location of the group which contains the closing character at its second location, at a first location in a compressed data sequence list, and transfer of the index of said location of said compressed data sequence list to the third location of said group containing said closing character at its second location;

II. for the further sequence components:

(16) checking whether the first element of the following sequence component is already present in the first column of the character list and if no, entry at the following location of the first column;

(17) repetition of step (16) in respect of the second element of the following sequence component;

(18) checking whether a group is present in the group list, which contains the character list index of the first element at the first location and the character list index of the second element at the second location, and if no, go to step (19), if yes, go to step (20);

(19a) entry of the character list index in respect of the first and second elements at the first and second locations respectively of a further group in the group list;

(19b) entry of the group list index in respect of the first and second elements in the second column of the character list at the locations set forth in step (16) and step (17) respectively if there is still no group list entry thereat;

(19c) performance of steps (7) through (15);

(20) checking whether said group set forth in step (18) above is followed by a further group which contains the character list index of the following element at its second location; if no, go to step (21), if yes, go to step (22);

(21) performance of steps (12) and (13) in respect of the group set forth in step (18) above, and steps (14) and (15);

(22) checking whether the following group set forth in step (20) above is in turn followed by a group which contains the character list index of the following element at its second location; if no, go to step (23), if yes, go to step (24);

(23) performance of steps (12) and (13) in respect of said following group set forth in step (20) above, and steps (14) and (15); and (24) repetition of step (22) in respect of the next following group.

10. A process for the decompression of a sequence of serial data elements compressed as set forth in claim 9, comprising the following steps:

I.

(1) calling up the first entry of the compressed data sequence list;

(2) checking whether the entry is an index in respect of the third location of a group in the group list, if no, output of the entry and go to step (6) below, if yes, go to step (3) below;

(3) checking whether the entry at the first location of the group is the index in respect of the third location of a preceding group in the group list; if no, output of the entry of the first and second locations of the group and go to step (6) below, if yes, go to step (4) below;

(4) repetition of the checking operation set forth in step (3) above in respect of the preceding group, until reaching an initial group in the group list, in respect of which the entry at the first location of the character list index is an element;

(5) output of the entry of the first and second locations of the initial group and the second location of all groups which have been previously run through, including the group set forth in step (2) above;

(6) repeating the procedure for the next entry on the compressed data sequence list; and (7) translating the specified character list indexes.

11. A data compression process as set forth in claim 9 wherein, after entry of the character list index in respect of a following element at the second location of a further group, as set forth in step (10) of claim 9, checking whether the character list index has already been entered at one of the first and second locations of a preceding group and if yes, said preceding entry is replaced by the group list index of the entry in said further group.

12. A process for the decompression of a sequence compressed as set forth in claim 11 wherein, before output of the entry of the second location of a group of the group list, a check is made whether the entry is a group list index in respect of one of the first and second locations of a subsequent group and if yes, the checking operation in respect of the entry at said one of said first and second locations of the subsequent group and possibly further groups is repeated, until a character list index is reached, for output thereof.

13. A data compression process as set forth in claim 9 wherein, after entry of the index of the third location of a group of the group list at the first location of a further group as set forth in step (12) of claim 9, a check is made as to whether said index is already entered at the first location of a preceding group and if yes, said preceding entry is replaced by the group list index of the entry in said further group.

14. A process for the decompression of a sequence compressed as set forth in claim 13 wherein, before step (3) set forth in claim 10 is carried out, a check is made whether the entry from the first location of a group is the index in respect of the first location of a subsequent group and if yes, the checking operation in respect of the entry at said first location is repeated until an index is reached in respect of the third location of a preceding group.

15. A data compression process as set forth in claim 1 comprising the following steps:

I. for the first sequence component:
  (1) entry of the first element at the first location of a group in a group list having two-location groups, wherein the index of the first location of each group is the code designation in respect of the respective directly preceding group;
  (2) entry of the second element at the second location of said group of the group list;
  (3) entry of the index of the first location of another group of the group list at said first location thereof;
  (4) entry of the following element at the second location of said another group of the group list;
  (5) entry of the index of the first location of a further group of the group list at the first location thereof;
  (6) repetition of steps (4) and (5) in respect of all following elements of the sequence component, including the closing character;
  (7) entry of the index in respect of the first location following that group which contains the closing character at the second location thereof, at a first location of a compressed data sequence list, and transfer of the index of said first location of said first compressed data sequence list to the first location following the said group containing said closing character;

II. for the further sequence components:
  (8) checking whether there is a group in the group list which contains the first element at its first location and the second element at its second location, if no, go to step (9) below, if yes, go to step (10) below;
  (9a) entry of the first and second elements at the first and second locations respectively of another group in the group list;
  (9b) performance by steps (3) to (7) above;
  (10) checking whether the group set forth in step (8) above is followed by a group which contains the following element at its second location, if no, go to step (11) below, if yes, go to step (12) below;
  (11) performance of step (5) in respect of said group set forth in step (8) above, and steps (6) and (7);
  (12) checking whether the said following group set forth in step (10) above is in turn followed by a group which contains the following element at its second location, if no, go to step (13) below, if yes, go to step (14) below;
  (13) performance of step (5) in respect of said following group set forth in step (10), and steps (6) and (7); and
  (14) repetition of step (12) in respect of the next following group.

16. A process for the decompression of a sequence of serial data elements compressed as set forth in claim 15, comprising the following steps:

I.
  (1) calling up the first entry of the compressed data sequence list;
  (2) checking whether the entry at the first location of the group is the index of said first location, if no, output of the entry of the first and second locations of the group and go to step (5) below, if yes, go to step (3) below;
  (3) repeating the checking operation set forth in step (2) above in respect of the preceding group, until reaching an initial group in the group list, in respect of which the entry at the first location is an element;
  (4) output of the entry of the first and second locations of the initial group and the second location of all groups which have been previously run through, including the group set forth in step (2) above; and
  (5) repeating the procedure for the next entry on the compressed data sequence list.

17. A data compression process as set forth in claim 15 wherein, after entry of the following element at the second location of a further group as set forth in step (4) of claim 15, checking whether the element has already been entered at one of the first and second locations of a preceding group and if yes, said preceding entry is replaced by the index of the entry in said further group.

18. A process for the decompression of a sequence compressed as set forth in claim 17 wherein, before output of the entry of the second location of a group of the group list, as set forth in step (4), a check is made as to whether the entry is an index in respect of one of the first and second locations of a subsequent group and if yes, the checking operation in respect of the entry at said one of said first and second locations of said subsequent group and possibly further groups is repeated, until an element is reached, for output thereof.

19. A data compression process as set forth in claim 15 wherein, after entry of the index of the first location of a group of the group list at the first location of a further group, a check is made as to whether said index has already been entered at said first location of said first-mentioned group and if yes, said preceding entry is replaced by the index of the entry in said further group.

20. A process for the decompression of a sequence compressed as set forth in claim 19 wherein, before step (2) set forth in claim 16 is carried out, a check is made whether the entry at the first location of a group is the index in respect of the first location of a subsequent group and if yes, checking in respect of the entry at the first location is repeated until an index in respect of the first location of a preceding group is reached.

21. A data compression process as set forth in claim 1 comprising the following steps:

I. for the first sequence component:
  (1) entry of the first element at a location in a first column of a character list;
  (2) entry of the character list index in respect of the first element at the first location of a group in a group list comprising two-location groups, wherein the index of the first location of each group is the code designation in respect of the respective directly preceding group;

(3) entry of the index of the first location of said group set forth in step (2) above in the second column of the character list at said first-mentioned location set forth in step (1) above;

(4) checking whether the second element is already present in the first column of the character list and if no, entry of said second element at the following location in the first column of the character list;

(5) entry of the character list index in respect of the second element at the second location in the first-mentioned group of the group list;

(6) entry of the index of the second location of the first-mentioned group in the second column of the character list at the location as set forth in step (4) above;

(7) entry of the index of the first location of another group of the group list at said first location thereof;

(8) checking whether the following element is already present in the first column of the character list and if no, entry at the following location of the first column of the character list;

(9) entry of the character list index in respect of the following element at the second location of said another group of the group list;

(10) entry of the index of the second location of said another group in the second column in the character list at the location as set forth in step (8);

(11) entry of the index of the first location of a further group of the group list at said first location thereof;

(12) repetition of steps (8) through (11) above in respect of all following elements of the sequence component, including the closing character; and (13) entry of the group list index in respect of the first location following that group which contains the character list index of the closing character at its second location, at a first location of a compressed data sequence list, and transfer of the index of said first location of said compressed data sequence list to the first location following the said group containing said closing character;

II. for the further sequence components:

(14) checking whether the first element of the following sequence component is already present in the first column of the character list and if no, entry at the following location in the first column of the character list;

(15) repeating step (14) in respect of the second element of said following sequence component;

(16) checking whether the group list has a group which contains the character list index of the first element at the first location of said group and the character list index of the second element at the second location of said group; if no, go to step (17), if yes, go to step (18);

(17a) entry of the character list index in respect of the first and second elements at the first and second locations of another group in the group list;

(17b) entry of the group list index in respect of the first and second elements in the second column of the character list at the locations as set forth in steps (14) and (15) respectively, if there is still no group list entry thereat;

(17c) carrying out steps (7) to (13) above;

(18) checking whether the group set forth in step (16) above is followed by another group which contains the character list index of the following element at the second location thereof, if no, go to step (19) below, if yes, go to step (20) below;

(19) carrying out step (11) above in respect of the group set forth in step (16) above, and steps (12) and (13) above;

(20) checking whether said following group as set forth in step (18) above is in turn followed by a group which contains the character list index of the following element at the second location thereof, if no, go to step (21) below, if yes, go to step (22) below;

(21) carrying out step (11) above in respect of said following group as set forth in step (18) above, and steps (12) and (13) above; and (22) repeating step (20) in respect of the next following group.

22. A process for the decompression of a sequence of serial data elements compressed as set forth in claim 21 comprising the following steps:

I.

(1) calling up the first entry of the compressed data sequence list;

(2) checking whether the entry at the first location of the group is the index of said first location, if no, output of the entry of the first and second locations of the group and go to step (5) below, if yes, go to step (3) below;

(3) repeating the checking operation of step (2) above for the preceding group until reaching an initial group in the group list, in respect of which the entry at the first location thereof is the character list index of an element;

(4) output of the entry of the first and second locations of the initial group and the second location of all groups which have been previously run through, including the group set forth in step (2) above;

(5) repeating the procedure for the next entry of the compressed data sequence list; and (6) translating the outputted character list indexes into the data elements by means of the character list.

23. A data compression process as set forth in claim 21 wherein, after entry of the character list index in respect of a following element at the second location of a further group as set forth in step (9) above, a check is made as to whether the character list index has already been entered at one of the first and second locations of a preceding group and if yes, said preceding entry is replaced by the group list index of the entry in said further group.

24. A process for the decompression of a sequence compressed as set forth in claim 23 wherein, before output of the entry of the second location of a group of the group list as set forth in step (4) of claim 22, a check is made as to whether the entry is a group list index in respect of one of the first and second locations of a subsequent group and if yes, the checking operation in respect of the entry at said one of said first and second locations of said subsequent group and possibly further groups is repeated until a character list index is reached, for output thereof.

25. A data compression process as set forth in claim 21 wherein, after entry of the index of the first location of a group of the group list at the first location of a further group, as set forth in step (11) of claim 21, a check is made as to whether said index has already been entered at said first location of said first-mentioned group and if yes, said preceding entry is replaced by the group list index of the entry in said further group.

26. A process for the decompression of a sequence compressed as set forth in claim 25 wherein, before step (2) of claim 21 is carried out, a check is made as to whether the entry at the first location of a group is the index in respect of the first location of a subsequent group and if yes, the operation in respect of checking the entry at the first location of a group is repeated until an index in respect of the first location of a preceding group is reached.

27. A process as set forth in claim 1 wherein, after entry of a code designation in the compressed data sequence list, a check is made as to whether said code designation is already entered at a preceding location and if yes, said preceding entry is replaced by the index of the entry which has just been made.

28. A process as set forth in claim 1 for texts which are divided on the basis of lines; letters, characters and spaces of the text representing the elements and words of the text representing the sequence components, wherein the lines are each subject to at least one governing factor from the group comprising a predetermined maximum number of words and a predetermined maximum number of elements, wherein, for the purposes of identifying line changes the respective code designation of the group containing the last element of a line has a negative sign allocated thereto.

29. A process as set forth in claim 1 wherein the stores used for storing the lists form a sequentially connected array and references in the lists leading to a location on the other side of the respective directly following store or a reference to a higher location in the directly following store are provided with an identification.

30. Use of the data compression process as set forth in claim 1 for automatically combining sequences of serial data elements wherein the nodes of the combination are formed by identical sequence components.

31. Use as set forth in claim 30 wherein, for the purposes of making a connection between an initial point which is in a first sequence and a target point which is in a second sequence, an identical sequence is sought in the compressed data sequence lists of the two sequences.

32. Use as set forth in claim 30 wherein, for the purposes of making a connection between an initial point which is in a first sequence and a target point which is in a second sequence that is not directly combined with the first sequence, the compressed data sequence list of the first and second sequences are each compared to the compressed data sequence lists of further sequences, in order to find a closed connecting path by way of identical sequence components of a respective two directly interconnected sequences.

33. Use as set forth in claim 1 wherein said nodes are stored in a separate list.

34. A data processing method including compression of redundant sequences of serial data elements which are divided into sequence components each having any number of data elements and a closing character, comprising the following steps:
I. for the first sequence component:
(1) the first and second elements are combined to form a first pair group which receives a code designation and which is stored together therewith in a group list;

(2) the code designation of the first pair group and the third element are combined to form a further pair group which receives a code designation and which is stored together therewith in the group list; and (3) the code designation of the further pair group and the following element are combined to form a further pair group which receives a code designation, and so forth, to the closing character which with the code designation of the preceding pair group forms a last pair group which in turn receives a code designation and which is stored together therewith in the group list;

II. for the second and further sequence components:
(4) steps (1) through (3) are repeated, but with checking as to whether the first pair group is identical with the first pair group of the first sequence component or one of the further sequence components;
if no, then proceed as in respect of the first sequence component;
if yes, the code designation of the first pair group is combined with the third element and a check is again made as to whether that further pair group is identical with the further pair group of said first or said further sequence component;
if yes the code designation of the further pair group is combined with the following element, and so forth, to the end of identity between the groups;

(5) the code designation of the last identical pair group is stored in the group list and any further elements which occur are processed in accordance with step (3); and (6) each sequence component is identified in a compressed data sequence list by the code designation of its last pair group;

and decompression of the compressed sequence comprising the following steps:
(7) calling up the first code designation in the compressed data sequence list;
(8) checking whether the first member of the group identified by the code designation is a code designation or an element; if an element, output of the pair group and go to step (11), if a code designation, go to step (9);
(9) repeating the checking operation of step (8) for the group designated by the code designation, until reaching an initial group, of which the first member is an element;
(10) output of the said initial group and the second member of all groups which have been previously run through; and
(11) repeating the procedure for all subsequent code designations in the compressed data sequence list.

35. A machine process for the compression of redundant sequences of serial data elements which are divided into sequence components each having any number of data elements and a closing character, comprising the following steps:
I. for the first sequence component:
(1) combining the first and second elements to form a first pair of group, assigning a code designation to said first pair group and storing said first pair group and said code designation in a group list;
(2) combining the code designation of the previous pair group and the next element to form a further pair group assigning a further code designation to said further pair group and storing said further pair group and said further code designation in the group list; and (3) reiterating step 2 until the closing character is reached;

II. for the second and further sequence components:

(4) performing steps 1-3, but checking as to whether the first pair group is identical with the first pair group of the first sequence component or one of the further sequence components;

if not, proceeding as in steps 1-3 first sequence component; and (5) if yes, combining the code designation of the previous pair group with the next element and checking whether that further pair group is identical with the further pair group of said first or said further sequence component;

if yes, combining the code designation of the further pair group with the following element, and reiterating step 5 until the end of identity between the groups; and (6) storing the code designation of the last identical pair group in the group list and performing step 3.

* * * * *

UNITED STATES PATENT AND TRADEMARK OFFICE
CERTIFICATE OF CORRECTION

PATENT NO. : 4,491,934
DATED : January 1, 1985
INVENTOR(S) : Karl Eckhart Heinz

It is certified that error appears in the above-identified patent and that said Letters Patent is hereby corrected as shown below:

Column 1, line 24 delete "colour" insert

--color--.

Signed and Sealed this

Sixth Day of August 1985

[SEAL]

Attest:

DONALD J. QUIGG

Attesting Officer    Acting Commissioner of Patents and Trademarks